United States Patent
Reynaerts et al.

(10) Patent No.: US 7,478,481 B2
(45) Date of Patent: Jan. 20, 2009

(54) MEASUREMENT CONFIGURATION BASED ON LINEAR SCALES ABLE TO MEASURE TO A TARGET ALSO MOVING PERPENDICULAR TO THE MEASUREMENT AXIS

(75) Inventors: Dominiek Reynaerts, Haasrode (BE); Jun Qian, Bertem (BE); Dries Hemschoote, Loppem (BE); Hendrik Van Brussel, Kessel-Lo (BE)

(73) Assignee: K.U. Leuven Research & Development, Leuven (BE)

( * ) Notice: Subject to any disclaimer, the term of this patent is extended or adjusted under 35 U.S.C. 154(b) by 228 days.

(21) Appl. No.: 11/569,648

(22) PCT Filed: May 27, 2005

(86) PCT No.: PCT/BE2005/000087

§ 371 (c)(1),
(2), (4) Date: Nov. 27, 2006

(87) PCT Pub. No.: WO2005/116783

PCT Pub. Date: Dec. 8, 2005

(65) Prior Publication Data

US 2008/0040941 A1   Feb. 21, 2008

(30) Foreign Application Priority Data

May 27, 2004   (GB) .................................. 0411837.8

(51) Int. Cl.
*G01D 13/02* (2006.01)
(52) U.S. Cl. .............................. 33/1 M; 33/706; 33/568
(58) Field of Classification Search .................. 33/1 M, 33/568–569, 573, 706, 707, 503
See application file for complete search history.

(56) References Cited

U.S. PATENT DOCUMENTS 5,142,146 A    8/1992   Morokuma (Continued)

FOREIGN PATENT DOCUMENTS

| EP | 1180662 A2 | 2/2002 |
| WO | WO 01/52004 A1 | 7/2001 |

OTHER PUBLICATIONS

International Search Report (PCT/BE2005/000087), mailed Oct. 20, 2005.

(Continued)

*Primary Examiner*—Yaritza Guadalupe-McCall
(74) *Attorney, Agent, or Firm*—Clark & Elbing LLP

(57) ABSTRACT

Laser interferometers and high-quality linear encoders both are competitive linear measurement systems used in high-precision machines. Plane laser interferometry allows measuring to a target that moves perpendicular to the measurement direction and to set up the laser beam in line with the functional point. In this way, a stacking of measurement systems can be avoided and a measurement configuration complying with the Abbe principle can be configured. On the other hand, laser interferometry is known to be sensitive to environmental changes. High-quality linear scales are used as an alternative. A disadvantage of linear scales is that the target is only allowed to move along the measurement axis. For targets translating in more than one direction with a range over several millimeters, this leads to a simple stacking of several linear scales together with the supporting slides. This indirect way of measuring introduces errors and partially destroys the accuracy provided by modern linear scales. This patent describes a measurement concept based on linear scales, which combines the stability to environmental changes, typical for linear scales, with the ability to measure to a target that moves also in a direction perpendicular to the measurement axis, typical for plane mirror laser interferometry. The measurement concept is especially interesting for multi-axis machines where a stable and homogeneous atmosphere cannot be guarantied and where measurements should be done during motion.

15 Claims, 3 Drawing Sheets

U.S. PATENT DOCUMENTS

| | | | |
|---|---|---|---|
| 5,760,561 A | | 6/1998 | Chinju et al. |
| 6,791,699 B2* | | 9/2004 | Aoki .......................... 33/707 |
| 7,114,265 B2* | | 10/2006 | Mies .......................... 33/503 |
| 7,127,824 B2* | | 10/2006 | Mies .......................... 33/503 |
| 7,319,815 B2* | | 1/2008 | Seo ............................ 33/1 M |
| 2001/0029674 A1* | | 10/2001 | Cutler ........................ 33/1 M |
| 2002/0029488 A1 | | 3/2002 | Nishi |

OTHER PUBLICATIONS

Written Opinion of the International Searching Authority (PCT/BE2005/000087), mailed Oct. 20, 2005.

Response to the Written Opinion mailed Oct. 20, 2005 (PCT/BE2005/000087), dated Mar. 30, 2006.

Written Opinion of the International Searching Authority (PCT/BE2005/000087), mailed May 22, 2006.

Response to the Written Opinion mailed May 22, 2006 (PCT/BE2005/000087), dated Jul. 19, 2006.

Notification Concerning Informal Communications with the Applicant (PCT/BE2005/000087), mailed Aug. 31, 2006.

Response to the Notification Concerning Informal Communications with the Applicant mailed Aug. 31, 2006 (PCT/BE2005/000087), dated Sep. 13, 2006.

International Preliminary Report on Patentability (PCT/BE2005/000087), mailed Sep. 25, 2006.

* cited by examiner

MEASUREMENT CONFIGURATION BASED ON LINEAR SCALES ABLE TO MEASURE TO A TARGET ALSO MOVING PERPENDICULAR TO THE MEASUREMENT AXIS

CROSS-REFERENCE TO RELATED APPLICATIONS

This application is the U.S. National Stage of International Application Serial No. PCT/BE2005/000087, filed May 27, 2005, which, in turn, claims benefit of British Patent Application Serial No. 0411837.8, filed May 27, 2004.

FIELD OF THE INVENTION

The present invention relates to a measurement configuration, which combines the robustness of linear scales with the capability to measure to a target also moving in a direction perpendicular to the measurement axis.

BACKGROUND OF THE INVENTION

Figure 1:
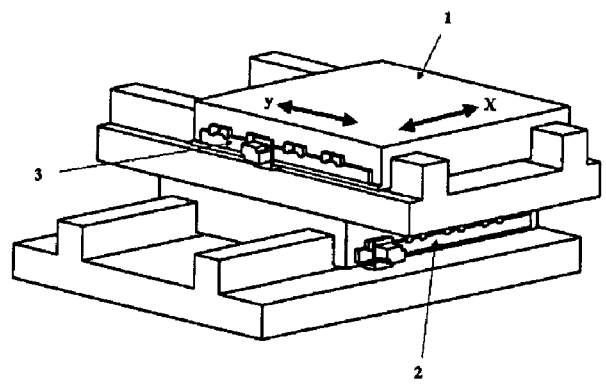

In traditional machine designs several sliders are stacked to generate 2- and 3-axis machines. With conventional use of scales, it is not possible to measure directly the position of a slide, which moves also perpendicular to the measurement direction. As a result the measurement system often consist of a simple stacking of several linear scales together with the supporting slides. In this way the position of the end effector is not directly measured and Abbe offsets are present. Although high quality scales are used, the final performance will depend on the straightness and orthogonality of the different guide ways. Often the system is calibrated to correct for these errors, but still deformations due to thermal effects and due to the flexibility of the bearings and the structure will reduce the final performance. FIG. 1 gives an example where the X- and Y-position of the slide 1 is respectively derived from the X-scale 2 and Y-scale 3.

A combination of a traditional use of scales for long stroke measurements, with short stroke sensors to measure straightness deviation and deformations could be used. This however requires a high number of sensors and reference straight edges. Plane laser interferometry is traditionally used to overcome this problem. However, while the sensitivity for environmental changes of scales is limited to the expansion of the scale, laser interferometry on the other hand is influenced by pressure, humidity, temperature and air composition.

In laser interferometry efforts are focussed on maximizing the stability of the measurement. Laser beams in vacuum or He— atmosphere offer the ultimate performance, but are also expensive. Common practice is to correct for the environmental disturbances by using tracking refractometers or by measuring pressure, temperature and humidity. The final result will still be dependent on the homogeneity of the air and the presence of turbulences. Especially for machine tools where measurements should be done during motion and cutting fluids are present, it is difficult to quantify these disturbances. Shielding the laser beam or creating a more homogeneous environment by introducing airflow is often applied, but this is also more difficult to accomplish for multi-axis machine tools compared to for instance single axis measurement machines.

In the field of scales, a special configuration based on scales offering direct and Abbe free measurement exists (Van Seggelen, J. K. et al. (2002), 'Design of a 3D CMM with elastically guided z-axis and x, y axis with less than 2 mm ABBE offset', Proc. of the 3rd euspen International Conference 1, 29-32). In the cited configuration the scales for the X- and Y-measurement are moving to obtain an Abbe free measurement in X- and Y-direction. This configuration involves however two sliders for each moving scale of which the straightness of one of the sliders directly influences the measurement accuracy. Extending this solution for a target translating in three directions is also difficult/impossible. The more recent 2D-grating scales are of course also limited to 2D-translations.

SUMMARY OF THE INVENTION

The present invention provides a measurement configuration, which combines the robustness of linear scales with the capability to measure to a target also moving in a direction perpendicular to the measurement axis. As a result direct measurements are possible even for target surfaces translating in X-, Y- and Z-direction. The configuration offers lower sensitivity to environmental changes compared to laser interferometry in air. The measurement configuration of the present invention is well suited to monitor the movements of a slide in a machine tool. The system of the present invention is advantageous over laser interferometry in situations were a stable and uniform temperature is difficult to guarantee and where measurements should be done during motion. Therefore, it is a first object of the present invention to provide a slide position measurement system comprising a reference surface mounted on or integrated in the slide and a scale carrier guided along the measurement axis, said bar comprising a scale indicating the position of the scale carrier on the measurement axis and a short stroke sensor at the endpoint of the scale carrier in line with the linear encoder, whereby said short stroke sensors allows the measurement of the gap between the reference surface and the sensor and wherein said bar can be driven such that the gap between the short stroke sensor and the reference surface remains within the measurement range of the short stroke sensor.

DETAILED DESCRIPTION OF THE INVENTION

List of Figures
FIG. 1. Traditional stacked measurement configuration
FIG. 2. 3D-example of traditional set-up with plane mirror laser interferometry
FIG. 3. 3D-example of alternative scale configuration
FIG. 4. Lay-out of one measurement axis
FIG. 5. Externally driven active scale
FIG. 6. The motion of the target surface passively drives the active scale
FIG. 7. Conceptual drawing of active scale combined with a separate measurement frame
FIG. 8. Dummy capacitive sensor

DESCRIPTION

The present invention provides a slide position measurement system having a measurement configuration similar to one used for laser interferometry, but replacing the laser beams by linear scales moving in their longitudinal direction only tracking the translation of a slide in that same direction. Said measurement system comprises a short stroke sensor attached at the front-end of the scale carrier, whereby said short stroke sensors works in conjunction with a reference surface mounted on the slide. Preferably, the short stroke sensor is an inductive, capacitive or optical sensor. It is clear that the selection of the sensor will determine the nature of the reference surface. In case a capacitive probe is used as short stroke sensor, the reference surface needs to be conductive, for instance a Zerodur plate with a conductive layer. In case an inductive sensor is used the target should be made in a conductive material. To obtain maximal accuracy, it is advised that the reference surface is calibrated. Preferably the reference surface is calibrated on the machine itself.

The short stroke sensor used in the system of the present invention should be selected according to the environmental conditions during operation. The variation of the sensor measurements due to fluctuation in environmental conditions should be as low as possible, preferably below 50 nm, more preferably below 20 nm, for instance below 10 nm, while the measurement stroke of the sensor should be as high as possible. Given the presently available short stroke sensors having a variation below 50 nm in between measurements due to environmental variations in air, an appropriate sensor for use in an air environment shall have a measurement stroke not exceeding 500 µm.

In a first embodiment the measurement system comprises a separate drive system to actuate the scale carrier in order to maintain the gap between the front-end of the scale carrier and the reference surface within the measurement range of the short stroke sensor. The output of the short stroke sensor is used as feed back signal for the drive system. The drive system can be attached to the structural frame of the machine, while the measurement head of the scale can be attached to an optional separate measurement frame. In this way no drive forces are lead through the measurement elements.

In a second embodiment the scale is driven by the motion of the slide carrying the tool or workpiece or by an underlying slide, which only translates in the measurement direction. In the latter case the scale carrier can be directly connected to that underlying slide. In case the scale is driven by the slide carrying the tool or workpiece there is a need for a contact-less connection between the front-end of the scale carrier and the reference surface, such as an air bearing preloaded with magnets or a vacuum pad. Preferably, said connection should be configured so that it maintains the front-end of the scale carrier and the reference surface within the measurement range of the short stroke sensor. The person skilled in the art will understand that in this embodiment the inertial forces of the scale will load the target. Therefore, this configuration is particularly suited in equipment wherein a slide is subjected to small accelerations only, which is for instance the case in high precision grinding machines.

In both embodiments the position of the slide on the measurement axis can be calculated based on the read out of the scale and the distance measured by the short stroke sensor.

In a particular variant of the second embodiment no short stroke sensor is required on the front end of the scale carrier. This is possible when the contact-less connection between the scale carrier and the slide is configured such that the variation of the gap between the front-end of the scale carrier and the slide is maintained within the limits of the accepted errors on the position measurements. In this case the position of the slide on the measurement axis can be calculated based on the read out of the scale and the known length of the gap between the front-end of the scale carrier and the slide.

The measurement system of the present invention is particularly suited for use in high precision machines comprising at least one slide on which either a workpiece or a tool can be mounted. These precision machines can either be working machines such as, a grinding machine, a single point diamond turning machine or a working machine which uses an ion beam, electron beam or laser beam, or measuring machines such as, a co-ordinate measuring machine or a scanning machine.

A non-limiting description of the present invention with reference to figures is given below.

1.1. Basic Lay-Out

Figure 2:
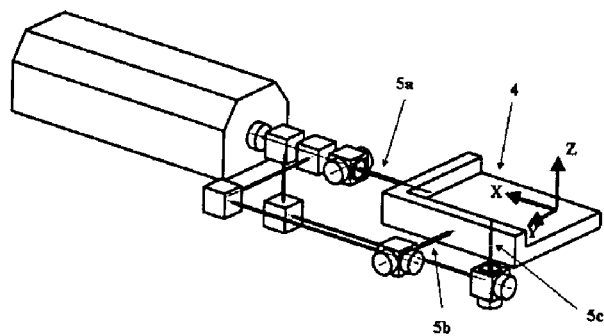
Figure 3:
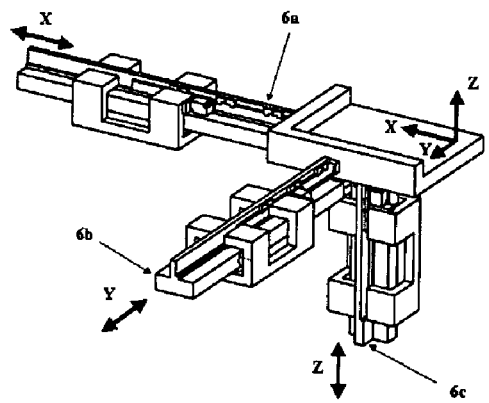
Figure 4:
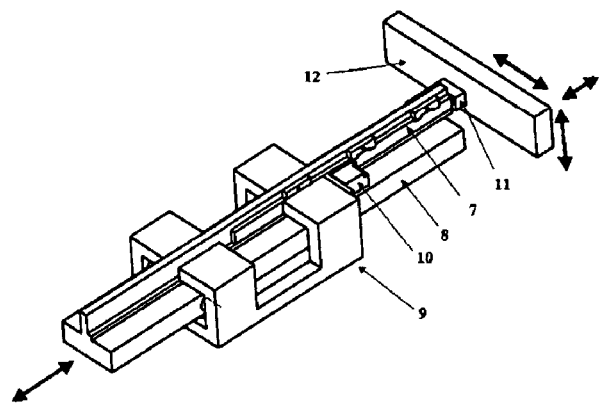

FIG. 2 shows an example of a set-up with plane mirror interferometers. The X-laser beam 5a, the Y-laser beam 5b and the Z-laser beam 5c, tracking respectively the X-, Y- and Z-movement of the slide 4, can respectively be replaced by the measurement modules 6a, 6b and 6c (FIG. 3). These measurement modules use linear scales for the long stroke measurement and are further called "actives scales".

1.2. Lay-Out of One Active Scale

One active scale (FIG. 4) consists of a linear scale 7 supported by a scale carrier, in case a bar 8 guided by a guideway 9. The guideway 9 only permits translational movement of the bar 8 in the direction of the measurement axis. On top of bar 8 a short stroke sensor 11 is attached in line with the linear scale. The short stroke sensor 11 measures the gap to the target surface 12. The bar 8 is driven to keep the output of the short stoke sensor 11 constant, or at least within its measurement range. The position along the measurement axis is the sum of the output signal from the short stroke sensor 11 and the long stroke sensor; linear scale outputted by the reading head 10.

1.3. Drive Mechanism of the Active Scale

Several embodiments of the active scale exist depending on the applied principle to drive the active scale. Several principles can be applied.

1.3.1. Active Drive Mechanism

Figure 5:
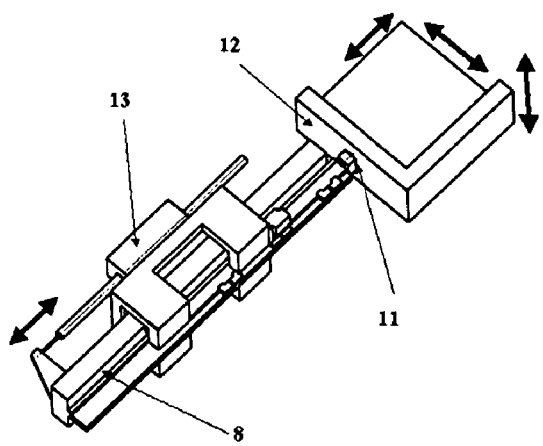

FIG. 5 shows an example where an external actuator 13 is used to drive the bar 8. The output signal of the short stroke sensor 11, measuring the distance to the target surface 12, is used as error signal for the controller of the external actuator 13. In this way the scale is driven to keep the gap constant. In case the short stroke sensor 11 is contact less, applying this principle puts no load on the target surface 12.

1.3.2. Passive Drive Mechanism

Figure 6:
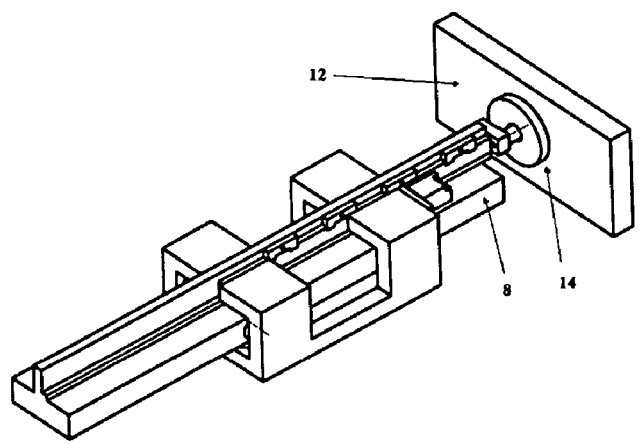

The bar carrying the scale can be driven trough the movements of the target surface or of one of the sliders to which the target surface is attached to. An embodiment where the target surface passively drives the scale is depicted in FIG. 6.

The bar 8 is connected to and driven by the target surface 12 trough an air bearing 14. The air bearing can be preloaded by vacuum, magnets or gravity. Optionally the front-end of the bar comprises a short stroke sensor measuring the distance between the front-end of the bar and a reference surface on the slide.

1.4. Short Stroke Sensor and Target Surface

Different embodiments of the active scale exist, depending on the short stroke sensor used. Preferably non-contact sensors are used. Depending on environmental conditions and preference, capacitive and inductive sensors could be used in combination with conductive targets or optical sensors in combination with optical surfaces. To obtain maximal accuracy, the target surface needs to be calibrated to serve as a reference surface. Preferably the target surface is calibrated on the machine itself. An example of on machine calibration of a similar target surface can be found in "Ruijl T. (2001), 'Ultra precision coordinate measuring machine—design, calibration and error compensation,' PhD thesis, Technische Universiteit Delft, NL".

1.5. Measurement Loop

Figure 7:
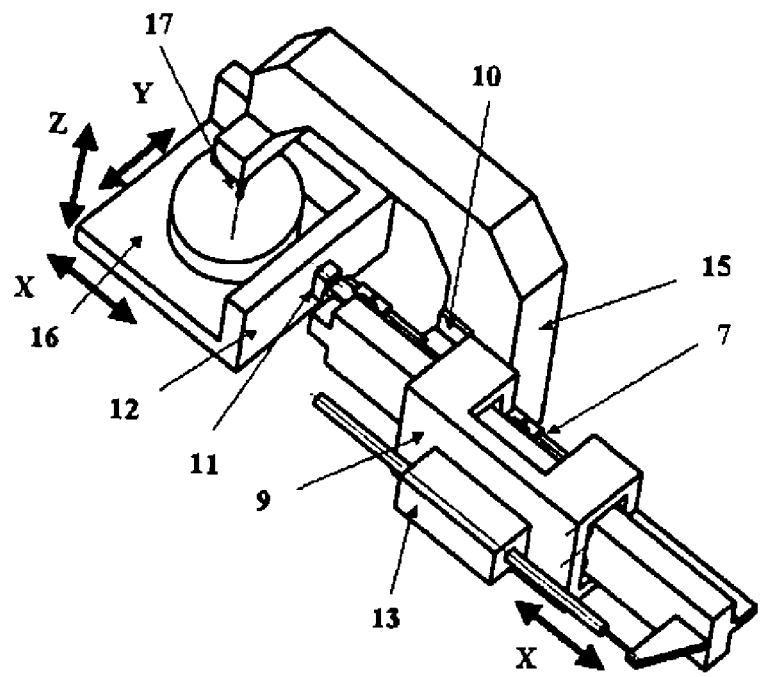

FIG. 7 shows an active scale measuring the X-position of the slide 16. The choice of machine elements to which the guide 9 and the reading head 10 is attached to, is not an intrinsic part of the measurement concept. Applying the rules of precision engineering, the machine should comprise a measurement frame and a structural frame. FIG. 7 shows a conceptual drawing of an active scale combined with a separate measurement frame (only partially shown). The reading head 10 is connected to the measurement frame 15, which is kinematically connected to the structural frame (not shown). The guide 9 and the drive 13 are connected to the structural frame. In this way no forces enter the measurement loop. The measurement loop in FIG. 7 comprises the target surface 12, the short stroke sensor 11, the scale 7, the reading head 10, the measurement frame 15 and in this case the probe 17.

EXAMPLE 1

Performance of a Slide Position Measurement System of the Present Invention

The accuracy of the measurement configuration is depending on the accuracy of the short stroke sensor 11, the linear scale 7 and the straightness of the bar 8. The short stroke sensor 11 and the scale 7 can be calibrated. Straightness errors of the bar 8 and tilting of the guide 9 only introduce cosine errors. For example, for a measurement stroke of 300 mm, a longitudinal distance between the supporting bearings of the bar of 150 mm and a straightness of the bar of 10 μm over 150 mm results in a position neglect able position error of 0.8 nm. This kind of straightness can easily be obtained. The bar can for instance be manufactured out of aluminum to minimize the mass of the moving parts. The stability of the measurement configuration is depending on the stability of the short stroke sensor 11 and the scale 7. By canceling the errors associated with long stroke measurements using laser interferometry in air, the stability of the measurement configuration can be increased. This is especially true for fast fluctuating, difficult to compensate disturbances, which can occur in long stoke measurements in air.

Figure 8:
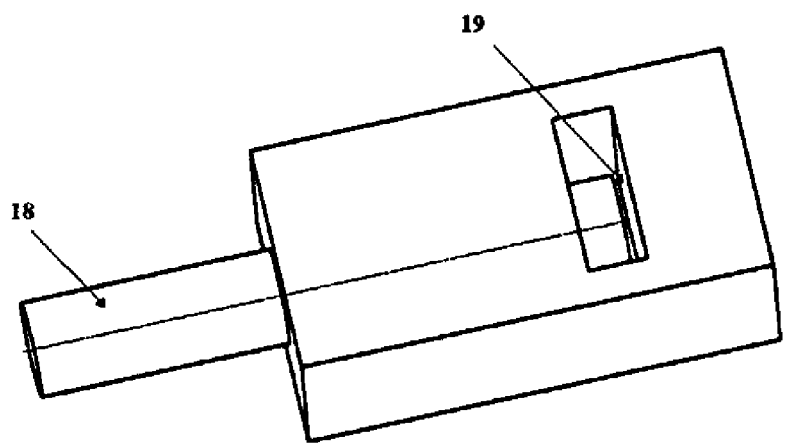

As an example Table 1 gives an error budget calculation in case a capacitive sensor is used as short stroke sensor. A dummy capacitive sensor is used to compensate for the effect of uniform environmental changes on the capacitive sensors. Data is based on the characteristics of Lion Precision capacitive sensor with a measurement range of 75 to 125 μm. FIG. 8 shows a dummy sensor comprising a capacitive sensor 18 measuring a constant distance to the fixed target surface 19. The Heidenhain LIP 481R is an example of a suitable low expansion linear encoder. The wavelength instability in the example is based on the Zygo ZMI laser head.

Error budget calculations indicate that the measurement configuration is advantageous, compared to laser interferometry in air, for measurement distances above 100 mm.

Tables

TABLE 1

Error budget for 300 mm measurement range (only stability considered)

| | Error [nm] |
|---|---|
| Laser interferometer with compensation | |
| Wavelength instability (peak to peak/24 h) | 6 |
| Non-uniform, non-compensated temperature changes | 150 |

TABLE 1-continued

Error budget for 300 mm measurement range (only stability considered)

| | Error [nm] |
|---|---|
| (0.5 degr. peak to peak) | |
| Non-uniform, non-compensated humidity changes (5% peak to peak) | 15 |
| Root Mean Square | 151 |
| Active scale with compensation | |
| Zerodur scale | |
| Temperature stability scale (1 degr. peak to peak) | 15 |
| Capacitive sensor (50 μm range) | |
| Non-uniform, non-compensated temperature changes (0.5 degr. peak to peak) | 10 |
| Non-uniform, non-compensated humidity changes (5% peak to peak) | 42 |
| Sensor noise | 13 |
| Root Mean Square | 47 |

The invention claimed is:

1. A slide position measurement system comprising a scale carrier guided along a measurement axis, said scale carrier comprising a scale indicating a position of the scale carrier on the measurement axis and a short stroke sensor at an endpoint of the scale carrier in line with the scale, said short stroke sensor working in conjunction with a reference surface mounted on or integrated in a slide, whereby said short stroke sensor allows measurement of a gap between the reference surface and the short stroke sensor and wherein said slide position measurement system comprises a drive system for driving the scale carrier under control of an output signal of the short stroke sensor such that the gap between the short stroke sensor and the reference surface remains within the measurement range of the short stroke sensor.

2. The slide position measurement system of claim 1, wherein the short stroke sensor is a non-contact sensor.

3. The slide position measurement system of claim 1, wherein the short stroke sensor is a conductive, capacitive, or optical sensor.

4. The slide position measurement system of claim 1, wherein the short stroke sensor is selected so that the variations in between measurements of the sensor due to the variations in environmental conditions during operation is below 50 nm.

5. The slide position measurement system of claim 1, wherein the scale carrier can be driven by a separate actuator.

6. The slide position measurement system of claim 1, wherein the scale carrier can be driven by a direct connection between the scale carrier and an underlying slide, which only translates in the measurement direction.

7. The slide position measurement system of claim 1, wherein the scale carrier can be driven by a contact-less connection between the scale carrier and the slide.

8. The slide position measurement system of claim 7, wherein the contact-less connection is an air bearing preloaded with magnets or a vacuum pad.

9. The slide position measurement system of claim 1, wherein the short stroke sensor is adapted for measuring a distance in line with the measurement axis of the scale carrier on which it is mounted.

10. A measurement configuration allowing the measurement of the translations of a slide in three dimensions, wherein said measurement configuration comprises three slide position measurement systems according to claim 1, and wherein said slide position measurement systems allow the measurement of the position of the slide along the x, y, and z axis, respectively.

11. A high precision machine comprising a moveable slide and a slide position system according to claim 1.

12. The high precision machine of claim 11, wherein the high precision machine is a working machine.

13. The high precision machine of claim 12, wherein the working machine is a grinding machine, a single point diamond turning machine, or a working machine which uses an ion beam, electron beam, or laser beam.

14. The high precision machine of claim 11, wherein the high precision machine is a measuring machine.

15. The high precision machine of claim 14, wherein the measuring machine is a co-ordinate measurement machine or a scanning machine.

* * * * *